US007105833B2

(12) United States Patent
Brunner et al.

(10) Patent No.: US 7,105,833 B2
(45) Date of Patent: Sep. 12, 2006

(54) DEFLECTION SYSTEM FOR A PARTICLE BEAM DEVICE

(75) Inventors: Matthias Brunner, Kirchheim-Heimstetten (DE); Ralf Schmid, Poing (DE)

(73) Assignee: AKT Electron Beam Technology GmbH, Feldkirchen (DE)

( * ) Notice: Subject to any disclaimer, the term of this patent is extended or adjusted under 35 U.S.C. 154(b) by 0 days.

(21) Appl. No.: 10/477,664

(22) PCT Filed: Mar. 4, 2002

(86) PCT No.: PCT/EP02/02324

§ 371 (c)(1), (2), (4) Date: May 13, 2004

(87) PCT Pub. No.: WO02/093610

PCT Pub. Date: Nov. 21, 2002

(65) Prior Publication Data

US 2004/0188630 A1 Sep. 30, 2004

(30) Foreign Application Priority Data

May 11, 2001 (DE) ................................ 101 22 957

(51) Int. Cl.
*H01J 3/14* (2006.01)

(52) U.S. Cl. ................... 250/396 R; 250/310; 250/398

(58) Field of Classification Search ................ 250/311, 250/398, 396 R, 396 ML, 310

See application file for complete search history.

(56) References Cited

U.S. PATENT DOCUMENTS

| | | | | |
|---|---|---|---|---|
| 4,362,945 A | | 12/1982 | Riecke | 250/396 R |
| 4,684,808 A | | 8/1987 | Plies et al. | 250/396 R |
| 4,795,912 A | | 1/1989 | Maschke | |
| 5,894,124 A | * | 4/1999 | Iwabuchi et al. | 250/310 |
| 6,531,697 B1 | * | 3/2003 | Nakamura et al. | 250/311 |
| 6,614,026 B1 | * | 9/2003 | Adamec | 250/398 |

FOREIGN PATENT DOCUMENTS

| | | |
|---|---|---|
| EP | 1 045-425 A2 | 4/2000 |
| EP | 1 045-426 A2 | 4/2000 |
| JP | 60039748 A | 1/1985 |

* cited by examiner

*Primary Examiner*—Kiet Tuan Nguyen
(74) *Attorney, Agent, or Firm*—Patterson & Sheridan, LLP

(57) ABSTRACT

A particle beam apparatus and a device for an energy corrected deflection by a predetermined deflection angle of a particle beam coming in along a beam axis are disclosed, whereby the particle beam consists of charged particles with energy values scattered around a predetermined energy value. The device comprises a corrector, whereby the corrector, by means of a first electric field and a superimposed first magnetic field, deflects the charged particles depending on their energies, and whereby the direction of the charged particles with the predetermined energy value is maintained during the passage through the corrector. The device further comprises a deflector applied after the corrector, whereby the deflector, by means of a second electric field or by means of a second magnetic field, deflects the charged particles with the predetermined energy vague by the predetermined deflection angle away from the beam axis, whereby the deflector focuses the charged particles. Further, the device comprises a controller to control the corrector and the deflector.

20 Claims, 7 Drawing Sheets

DEFLECTION SYSTEM FOR A PARTICLE BEAM DEVICE

BACKGROUND OF THE INVENTION

1. Field of the Invention

The invention relates to a particle beam apparatus and a device for energy-corrected deflection of a particle beam of charged particles, and a method for energy-corrected deflection of a particle beam.

2. Description of the Related Art

Devices for deflection of particle beams of charged particles are utilized for particle beam apparatuses like, for example, electron microscopes, apparatuses of electron- or ion-lithography and for display apparatuses. For those applications, a particle beam of charged particles is to be deflected from an incoming direction to variable outgoing directions in order to reach different positions on a target surface.

The deflection of particle beams from an incoming direction to an outgoing direction generally results from applying electric or magnetic fields which apply lateral forces to the particle beam. The electric or magnetic fields are generated by deflectors that include electric or magnetic multipoles like, for example dipoles or quadrupoles. Thereby, the deflection angle between the incoming direction and the outgoing direction $\alpha_m$ caused by a homogeneous magnetic field of strength B perpendicular to the particle beam, is given by $$\alpha_m = k_m/\mathrm{SQRT}\ (W), \tag{1}$$

whereby SQRT(W) is the square root of the kinetic particle energy W of the charged particles and $k_m$ a constant, depending on particle mass, particle charge, the magnetic field strength and the angle between the magnetic field and the particle beam direction. Equation 1 is particularly valid in the case that the deflection angle is small compared to the angle between the particle beam and the magnetic field.

The deflection angle between the incoming direction and the outgoing direction $\alpha_e$, which is caused by a homogeneous electric field of strengths E perpendicular to the particle beam, is given by $$\alpha_e = k_e/W,$$

whereby $k_e$ is a constant, depending on particle mass, particle charge, the electric field strengths and the angle between the electric field and particle beam direction. Again, equation (2) is particularly valid in the case that the deflection angle is small compared to the angle between the particle beam and the electric field.

Because of the deflection angle's dependency on the particle energy W, only particles with a predetermined energy value become deflected by the predetermined deflection angle. Particles with an energy higher than the predetermined energy value are deflected less, and particles with a lower energy are deflected more. Since, in practice, the charged particles of a particle beam have a certain energy spread, the deflection angle's dependency on the energy of the charged particles results in an energy-depending dispersing of the particle beam when deflected. An energy-depending dispersing of a particle beam, also called chromatic aberration or “Farbfehler”, in often undesired since it may limit the spatial resolution of the particle beam apparatuses, particularly electron microscopes, apparatuses for electron- or ion-lithography and display apparatuses.

A device in which a particle beam of charged particles is deflected by a predetermined deflection angle in an energy-corrected way is disclosed in patent application U.S. Pat. No. 4,362,945. Therein, electrical fields and magnetic fields are superimposed perpendicular with respect to each other, whereby the forces of the electric fields on the charged particles counteract the forces of the magnetic fields on the charged particles. In addition, the forces of the magnetic field are dimensioned in such a way that the predetermined magnetic deflection angle $\alpha_m$ is twice as large as the predetermined electric deflection angle $\alpha_e$, whereby the energy-depending deviations from the predetermined deflection angle compensate each other. Thus, in the case that the energy-depending deviation is compensated, the deflection angle $\alpha$ is:

$$\alpha = \alpha_m - \alpha_e = \tfrac{1}{2}\alpha_m \tag{3}$$

The compensation of the energy-depending dispersing of the particle beam results from equation (1) and (2), from which follows:

$$\delta\alpha_m/\delta w = -\tfrac{1}{2}\alpha_m w \tag{1}$$

and $$\delta\alpha_e/\delta w = -\alpha_e/W \tag{5}$$

Equations (4) and (5) indicate that for the same deflection angles $\alpha_m$ and $\alpha_e$, the energy-depending dispersing of the particle beam due to an electric field is essentially twice as large as the one due to a magnetic field.

It is further to be said that the compensation of the energy-depending deviations is improved, the closer the particle beam deflection positions of the electric field and of the magnetic field are located to each other. The particle beam deflection position of a deflector is given by the intersection point of the optical axis of the incoming particle beam with the axis of the particle beam leaving the respective field.

The complexity for building particle beam apparatuses with energy correcting deflectors that superimpose electric and magnetic fields is considerable, since the fields for such deflectors must be higher than for deflectors without energy correction. The reason is that the fields must not only deflect the particle beam, but also compensate each other. The multipole elements for the generation of such fields thus are required to be larger and more complex; the generation of stronger magnetic fields requires, for example, larger coils or higher coil currents within the particle beam region, which in turn may require additional cooling.

Further, the deflectors require a larger aperture to make sure that also particle beams at large deflection angles can be guided through the deflector. A large aperture for the energy-corrected deflector, however, requires large deflection plate distances and large coil distances. In order to still provide the required electric and magnetic fields in the area of the particle beam, the electric potential at the deflection plates and the currents in the coils have to be scaled to correspondingly higher values. This leads to a further enlargement or the coils, the voltages and/or the coil currents of the deflector, which in turn further increases the volume and further limits the possible usage.

SUMMARY

Therefore, it is an object of the present invention to provide a particle beam apparatus, a device and a method for the energy correcting deflection of a particle beam which do not have the above-described disadvantages.

The objective of the present invention is solved by the particle beam apparatus according to claim 1, by the device for energy corrected deflection of the particle beam according to claim 5 and by the method to according to claim 14.

Further advantages, embodiments, details and aspects of the present invention are evident from the dependent claims, the description and the accompanying drawings.

The inventive particle beam apparatus, the device and the inventive method allow for an energy-corrected deflection of a particle beam by a predetermined deflection angle without the above-mentioned disadvantages. According to the invention, the corrector can exert forces to the incoming particle beam which changes the direction of the charged particles depending on their energy in such a way that the energy-depending deflection of the deflector focuses them. In this manner, the corrector can compensate an energy-depending dispersion of the particle beam that the deflector without corrector would otherwise inflict on the particle beam.

In this manner, the corrector providing the first electric and the first magnetic field may have a small aperture since, according to the invention, the first electric and the first magnetic field of the corrector are adjusted so that the charged particles with the predetermined energy value retain their direction. Only the charged particles with an energy deviating from the predetermined energy value are deflected. The size of the aperture of the corrector is, thus, no longer defined by the maximum deflection angle of the particle beam, but by the deviations of the particle energies around the predetermined energy value. For many particle beam apparatuses, the deviations are small enough to make the aperture of the corrector sufficiently small. The aperture of the corrector is generally defined by the distance between the deflection plates or by the distance between the coils of the corrector.

The invention makes it possible to distribute the functions of the deflection and of the energy correction to two spatially separated units, namely the corrector and the deflector. This way, both components can be optimized independently from each other with respect to functionality, volume and costs. This way, for example, the corrector can be equipped with a small aperture to provide a high electric or magnetic fields strength, while the deflector which has to provide a small electric or magnetic filed strength can have a large aperture. In particular the volume or the deflector can be made smallby avoiding energy correcting electric or magnetic fields. Thus, it is possible for the particle beam apparatus to position the deflector (as viewed in the particle beam direction) behind the objective lens, even if the working distance between the objective lens and the target surface is small.

It is a considerable advantage to position the deflection of the particle beam behind the objective lens since that way, the particle beam can be adjusted to pass through the objective lens along its optical axis. This largely eliminates chromatic or spherical aberrations of the objective lens. Further, in this way, the aperture of the objective lens which, for example, is given by its bore diameter, can be significantly reduced; this noticeably reduces the complexity of the lens. Preferably, the aperture of the objective lens can be made smaller than 20 mm and preferably smaller than 10 mm. Preferably, the particle beam is adjusted so that its distance to the optical axis during passage through the objective lens is smaller than 2 mm and preferably smaller than 0.5 mm.

According to the invention, the corrector deflects the charged particles depending on their energies. The deflection is such that the deflector focuses the charged particle with the second electric or the second magnetic field. This way, the corrector corrects the energy-depending dispersion of the particle beam which the deflector would generate without corrector.

Particle beam apparatuses with particle beam source, objective lens, corrector and deflector are used as electron microscopes, devices for electron- or ion-lithography or other devices which direct focused particle beams of charged particles onto target surfaces. Target surfaces can be, for example, samples or surfaces of samples which are to be inspected by the focused particle beam; further, target Surfaces can be samples that are to be structured with the focused particle beam, such as, for example, wafers for micromechanics or microelectronics, or also biological samples; finally, target surfaces can also be samples that are to be stimulated to any kind of reaction, such as glowing or switching, due to the bombardment with the particle beam.

The particle beam source of the particle beam apparatus according to the invention generates the particle beam. The charged particles are preferably tree electrons or ions. Preferably, the particle beam is limited to a maximum beam diameter by apertures, electric or magnetic lenses and other means, whereby the particle beam direction and the particle beam cross-section define the beam axis. Preferably, the beam axis of the particle beam generated with the particle beam source is essentially identical to the beam axis of the incoming particle beam that is to be deflected, or with the optical axis of the objective lens.

The charged particles of the particle beam are preferably accelerated to a predetermined energy value so that the particle beam, on arrival at the objective lens, at the corrector or at the deflector, consists of charged particles with energy values distributed around a predetermined energy value.

The objective lens of the particle beam apparatus it preferably a magnetic, an electric or an electromagnetic lens which has a focusing effect on the particle beam of charged particles. The focusing quality of the particle beam is a critical aspect for a good spatial resolution at which a sample is inspected, structured or treated in one or the other way.

In order to avoid optical defects due to spherical or chromatic aberrations of the objective lens, the charged particle beam passes through the objective lens along the optical axis. Such a particle beam path is possible if the deflector is positioned behind the objective lens. The present invention facilitates such an arrangement even at a small working distance by disclosing a deflector which can be positioned in a compact way behind the objective lens without a corrector.

For a maximum spatial resolution or a particle beam apparatus, is often necessary to position the objective lens very close, i.e. a few millimeters, to the target surface. In this case, the term "short working distance" is used. A short working distance can cause considerable problems if further components, like a deflector, have to be mounted between the objective lens and target surface. Therefore, in order to avoid an arrangement of the deflector in front of the objective lens, there is a large interest to have the spatial dimensions of the deflector as small as possible.

With the limited space of a small-sized deflector, the possibility of equipping the deflector with energy-correcting components is limited. The device according to the invention solves this problem since, in a first preferred embodiment, the corrector is positioned in front of the objective lens, while the deflector is positioned behind the objective lens. Since the inventive corrector keeps the direction of the charged particles with the predetermined energy value constant, it is ensured that the charged particles with the predetermined energy value pass through the objective lens along its optical axis. Only the charged particles whose energy values deviate from the predetermined energy value are deflected away from the optical axis of the objective lens and are subjected to spherical or chromatic aberrations of the objective lens. The influence of the spherical or chromatic aberrations of the objective lens, however, is only an error of the second order, since the aberrations apply only to such charged particles whose energy deviates from the predetermined energy value.

In the case that there is a large working distance, for example larger than about 30 mm, it is advantageous if the corrector and the deflector are located behind the objective lens, as seen in the direction of the particle beam. In this case, all charged particle can pass along the optical axis of the objective lens, so that no spherical or chromatic aberration effects occur, even for charged particles whose energies deviate from the predetermined energy value. In this case, the corrector, which requires strong electric and magnetic fields for a compensation of the energy-depending dispersing of the particle beam, can be provided with a small aperture, while the first deflector, which requires a large aperture for the deflection, only needs to provide electric and magnetic fields which are comparably small.

The corrector deflects the charged particles in dependency on their energies so that the particle beam is dispersed. Only the direction of the charged particles with the predetermined energy value is maintained during the passage through the corrector. This is realized if the ratio of the field strengths of the first magnetic field B and the first electric field E, perpendicular thereto, are essentially given by the relation:

$$B/E=\mathrm{SQRT}\ (m/2W) \quad (6)$$

Thereby, SQRT(m/2W) is the square root of (m/2W), whereby m is the mass of the charged particles, E is the electric field strength perpendicular to the particle beam and B the magnetic field strength perpendicular to the particle beam and perpendicular to the electrical field. Equation (6) is valid as a first approximation for non-relativistic particle energies and must be extended in the case of relativistic energies of the charged particles.

Since the direction of the charged particles with a predetermined energy value is maintained in the corrector, the aperture of the corrector can be chosen to be so small that it only has to be matched to the dispersing of the particle beam, not to an additional deflection of the particle beam. Preferably, the directions of the charged particles with the predetermined energy value are maintained during the passage through the corrector within 3 degrees and preferably within 1 degree.

The deflections conducted on the charged particles are such that the subsequent deflector focuses the deflected and the undeflected charged particles. This is realized by adjusting the strengths and direction of the first electric field E and the first magnetic field B in such a way that the energy-depending deflection of the particle beam by the second electric or second magnetic field of the deflector counteracts the dispersing of the particle beam by the first electric field E and the first magnetic field B of the corrector.

Since the deflector deflects the particle beams with predetermined energy value away from the beam axis, it is possible to have the deflector located directly behind the corrector, since the corrector has left the charged particles with predetermined energy value on the beam axis. “Directly behind the corrector” means that no components which use electric or magnetic fields for control of the particle beam are arranged between the corrector and the deflector. Thus, it is possible to perform an energy-corrected deflection by means of corrector and deflector with few optical components and with little space.

Since the deflector deflects the charged particles with predetermined energy value away from the beam axis, it is further possible that the objective lens is arranged between the corrector and the deflector, whereby the particle beam passes through the objective lens along the optical axis. In this case, the deflection is carried out behind the objective lens, in particle beam direction.

Preferably, the objective lens has a focal length, which focuses the particle beam to the same location as the deflector. This way, a focal point with the smallest possible dimension can be generated. The smaller the focal point, the larger can be the resolution of the particle beam apparatuses for structuring or sampling.

The device for energy-corrected deflection, and preferably the particle beam apparatuses as well, include a controller for controlling the deflector and the corrector in dependence of a predetermined deflection angle. The controller, for one thing, has the effect that the charged particles with the predetermined energy value maintain their direction during the passage through the corrector independently of the predetermined deflection angle, and that the deflector focuses the charged particles onto a target surface independently of the predetermined deflection angle. The target surface may be, for example, the surface of a sample to be inspected, to be structured or, in particular, to be tested.

The spatial resolution during structuring or sampling of the target surface is limited to a large extent by the focus area of the particle beam. The focus area is the area which is formed by the cross section of the deflected particle beam with the target surface. Preferably, the focus area is, independently of the deflection angle, smaller than 10 times the particle beam cross section of the particle beam incoming at the corrector. This demand is realized it the field strength and field directions of the corrector and if the field strengths and field directions of the deflector are sufficiently coordinated.

Preferably, the focused area is, independent of the predetermined deflection angle, also smaller than a single particle beam cross section of the particle beam arriving at the corrector. This specification can be realized, in particular, by means of an objective lens.

Devices that superimpose electric and magnetic fields for generating energy dependent deflections of charged particles of a particle beam are also known as Wien filters. However, the Wien filter, until now, has mainly been used for energy analysis and for a separation of charged particles of different energies, without the additional condition to compensate for energy-depending deflection errors of a subsequent deflector.

Preferably, the corrector includes a first electric multipole for generating a first electric field, and a first magnetic multipole for generating a first magnetic field. Preferably, the first electric field and the first magnetic field act with lateral forces on the charged particles which have opposite directions with respect to each other. Preferably, the opposing forces compensate each other on average so that the direction of charged particles with the predetermined energy is not changed.

Since the energy dependent dispersion of the particle beam in a deflecting electric field is twice as large as compared to a magnetic field deflecting at the same deflection angle (see equation (4) and (5)), the dispersion of the particle beam in the corrector can be freely adjusted by varying the B- and E-field-strengths at a constant B/E ratio. The B- and E-field strengths, according to the present invention, are adjusted at a constant B/E ratio in such a way that the deflector focuses the charged particles of the dispersed particle beam. Preferably, the B- and E-field strengths are further adjusted at a constant B/E ratio in order that the charged particles are focused on the target surface. Further, preferably, the charged particles are focused with the focus area on the target surface, which, independent of the predetermined deflection angle, is smaller than 10 times the cross section of the particle beam incoming at the corrector, and preferably smaller than one times the cross section of the particle beam incoming at the corrector.

The overlap of the first electric field and the first magnetic field has the effect that the particle beam deflection points of the first electric field and the second electric field are located close together. The particle beam deflection point of the first electric field is given by the intersection point of the beam axis of the incoming particle beam with the axis of the particle beam exiting the first electric field, whereby the first magnetic field is switched off. The particle beam deflection point of the first magnetic field is given by the intersection point of the beam axis of the incoming particle beam with the axis of the particle beam exiting the first magnetic field, whereby the first electric field is switched off.

Preferably, the first electric field and the first magnetic field are superimposed so that the particle beam deflection point or the first electric field and the particle beam deflection point of the first magnetic field are closer the 10 mn, closer than 5 mm and preferably closer than 1 mm to each other. This way, the corrector does not only leave the direction of the charged particles with predetermined energy value unchanged, but also prevents a parallel shift of those charged particles.

In a first preferred embodiment, the deflector includes a second electric multipole for generating a second electric field. In this case, the deflector is all electric deflector. In a second preferred embodiment, the deflector includes a second magnetic multipole for generating a second magnetic field. In this case, that deflector is a magnetic deflector. In a further embodiment, the deflector generates a second electric as well as a second magnetic field. Preferably, however, the deflector either includes a second electric or a second magnetic field. Thus, the deflector is preferably either an electric deflector or a magnetic deflector.

In a further preferred embodiment, the first and/or the second electric multipole is an electric dipole with two opposing deflection plates which generate the first and/or the second electric field. This way, the predetermined deflection of the particle beam can be realized within the plane defined by the particle beam direction and the direction of the first electric field. With a deflection of the particle beam within only one plane, the deflected particle beam can only be directed to the points along a line on the target surface. Preferably, the distance of the deflection plates with respect to each other define the size of the aperture of the deflector, and preferably of the corrector as well.

In a further preferred embodiment, the first and/or second electric multipole is an electric quadrupole or an electric octupole, which includes deflection plates arranged preferably symmetrically to the beam axis. In this case, first and/or second electric fields are generated. by applying suitable voltages at the respective opposing deflection plates, which can deflect the particle beam within any plane along the beam axis. This way, the deflected particle beam can be directed to the points of an area on the target surface. Preferably, the distance or the opposing deflection plates with respect to each other define the size of the aperture of the deflector, and preferably of the corrector as well.

In a further preferred embodiment, the first and/or the second magnetic multipole is a magnetic dipole, which generates a first and/or second magnetic field, preferably perpendicular to the beam axis. Preferably, the field strengths of the first and/or the second magnetic fields are controlled by a coil current at the magnetic dipole. This way, the predetermined deflection of the particle beam in the plane perpendicular to the first magnetic field can be realized, whereby the direction of the magnetic field is given by the orientation of the magnetic dipole. In this case, during deflection of the particle beam on a target surface, the deflected particle beam can only be directed to the points of a line on the target surface.

In a further preferred embodiment, the first and/or the second magnetic multipole is a magnetic quadrupole or a magnetic octupole, which are preferably arranged symmetrically to the beam axis. Preferably, the field strength of the first and/or a second magnetic field is controlled by a plurality of coil currents at the magnetic quadrupole or the magnetic octupole. In this case, first magnetic fields are generated by applying suitable coil currents, which can deflect the particle beam in any plane along the beam axis. This way, the particle beam can be directed during deflection to the points of an area on the target surface.

If the deflector includes a second electric multipole, the first and the second electric multipoles are aligned with respect to each other in such a way that they can generate electric fields at the particle beam which are orientated parallel or antiparallel with respect to each other. This way, an energy correcting deflection can be conducted in advantageous manner.

If the deflector includes a second magnetic multipole, the first and the second magnetic multipoles are aligned with respect to each other in ouch a way that they can generate magnetic fields at the particle beam which are orientated parallel or antiparallel with respect to each other. Preferably, in this case, the second magnetic field in the particle beam area is perpendicular to the second electric field.

In order to obtain a first and/or second magnetic field with sufficient and, as much as possible, homogeneous field strengths in the area of the particle beam, the coils of the magnetic multipoles are preferably saddle coils or toroid coils. Further, the first and or the second magnetic field are preferably concentrated by magnetic poles pieces.

Preferably, the controller controls the deflector and the corrector in correspondence to the input of a predetermined deflection angle automatically in a way that for each predetermined deflection angle, the first electric field required for the energy corrected deflection, the first magnetic field and the second electric or second magnetic field are automatically generated. Preferably, the controlling is synchronous to ensure that the energy corrected deflection endures at any point in time.

Preferably, the controller includes a predetermined algorithm which calculates and submits the necessary parameters for the controlling of the corrector and the first deflector for each predetermined deflection angle. Preferably, with this algorithm, the required voltages for the electrodes of the electric multipoles and the coil currents for the magnetic multipoles are calculated for each predetermined deflection angle of the particle beam.

Preferably, the charged particles of the particle beam are electrons which are generated by an electron beam source. In particular, the electron beam source is a thermionic electron source which emits electrons by thermal excitation of the electrons in a filament. Such electron sources can be, for example, tungsten filament sources, LaB6 sources, or thermionic field emission sources. Thermionic electron sources have the advantage that they are easy to produce and that they can be operated at comparably low vacuum. The disadvantage is that they generate particle beams with comparably high energy spread which is why, in this case, an energy corrected deflection is especially important.

BRIEF DESCRIPTION OF THE DRAWINGS

In the description below, several embodiments of the present invention are illustrated by means of drawings. Therein.

DETAILED DESCRIPTION

Figure 1A:
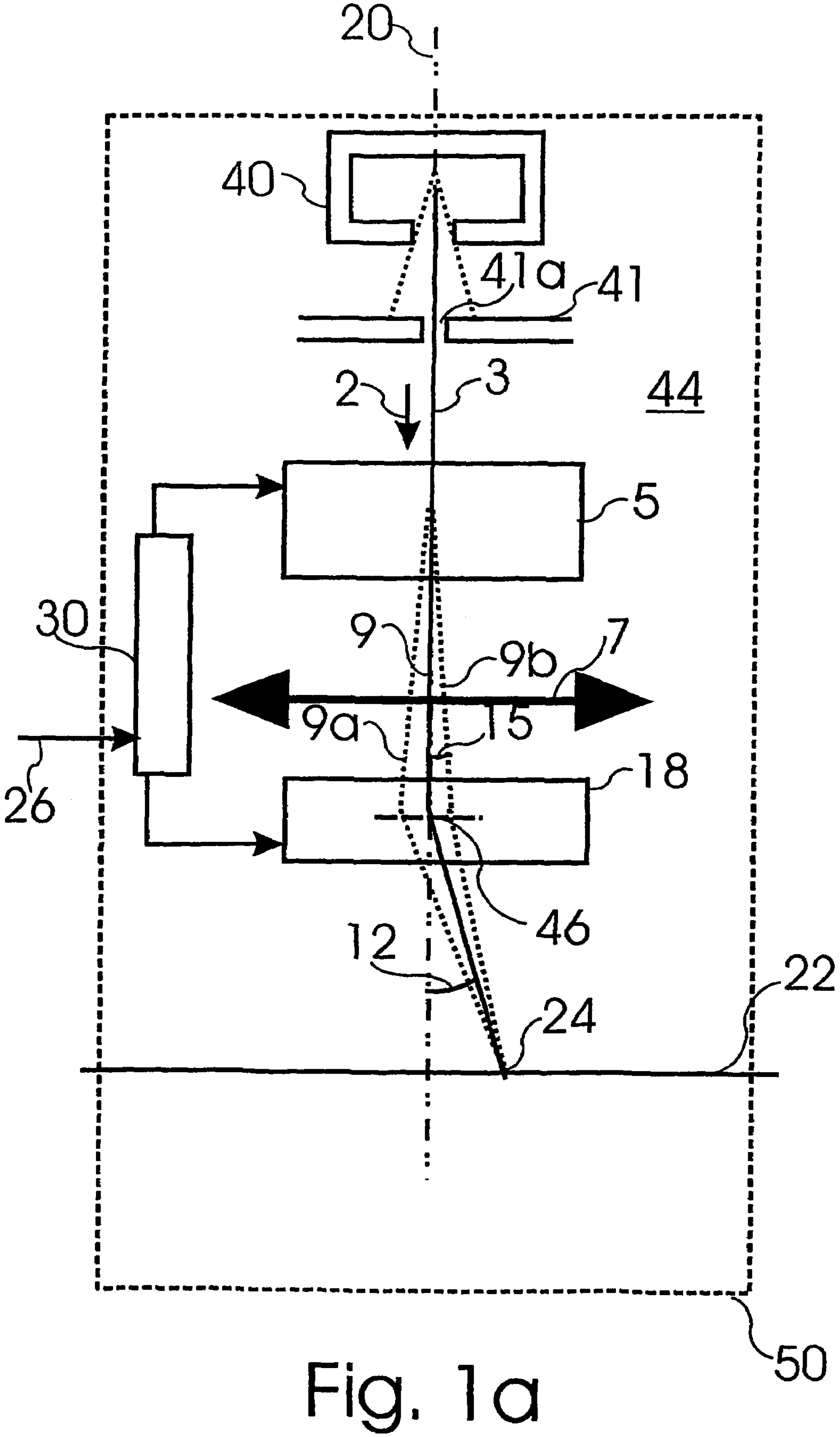
FIG. 1*a* shows a first embodiment according to the invention of a particle beam apparatus with an objective lens behind the corrector.

FIG. 1*a* shows schematically a first embodiment of a particle beam apparatus 50 according to the invention. In this embodiment, the deflector 38, as seen in particle beam direction, in behind the objective lens 7, whereas the corrector 5 is in front of the objective lens 7, as seen in particle beam direction. This embodiment allows the objective lens 7 to be positioned close to the target surface 22, since the deflector 18 can be realized as a simple electric or magnetic multipole without correction optics. Thus, the size of deflector is can be so small that it fits between the objective lens 7 and the target surface 22 even at a small working distance.

It is important to position the deflector 18 behind the objective lens 7 since this way, the particle beam 3 can be made to always pass along the optical axis of the objective lens 7. This way, chromatic or spherical aberrations of the objective lens 7 barely occur. Preferably, the optical axis of the objective lens 7 is axially symmetric to the beam axis 20. In FIG. 1*a,* the deflection by the deflector 13 takes place only after the objective lens, whereby the deflector 18 is preferably the last beam optical element for the particle beam 3 on its way to the target surface 22.

The particle beam apparatus 50 further includes a particle beam source 40 that emits charged particles into the vacuum 44. In this preferred embodiment, the particle beam source 40 is a thermionic electron source, for example an LaB6-source, a tungsten-filament-source or a thermionic field emission source, which emits electrons by thermal excitation. Typical temperatures for the emission operation, depending on the kind of particle beam source, are in the range between 1000° C. to about 4000° C. and preferably between 1600° C. and 3000° C. After emission, the released electrons are accelerated to the predetermined energy value by an anode 41, to which a predetermined electric potential is applied.

Through acceleration and apertures, the accelerated electrons form a particle beam 3 with an incoming direction 2. Such apertures, as an example, are illustrated in FIG. 1*a* by the aperture 41*a* of anode 41. In this case, particle beam 3 consists of electrons with energy values distributed around the predetermined energy value. The distribution of the energy values depends, for example, on the voltage stability of the voltage at anode 41 and on the kind of particle beam source 40. The thermionic particle beam sources are known to generate particle beams with a wider energy value distribution than cold field emission sources. For the present embodiment, the energy distribution of the particle beam, centered around a predetermined energy value of 20 keV, is smaller than 5 eV and preferably smaller than 2 eV. For a non-energy corrected deflection, much energy distribution can result in an energy depending dispersion of the particle beam that is large enough to damage the spatial resolution of a particle beam apparatus.

To a large extent, the invention is independent of the energy of the charged particles of the particle beam. It is preferably applied to particle beam apparatuses with particle beams 3 with an energy range between 500 eV and 15 keV, and even more preferred, within the two energy ranges between 700 eV and 200 eV or 6 keV and 10 keV.

The cross-section of the particle beam entering the corrector 5 can be very different, depending on the application. Preferably, the cross-section of the particle beam 3 entering the corrector 5 is smaller than the aperture of the corrector 5, of the deflector 18 and the objective lens. Further, the smaller the cross-section compared to the aperture of the objective lens, the smaller is the effect of chromatic and spherical aberrations by the objective lens 7. Preferably, the diameters of the particle beam cross-sections at the focusing objective lens are larger than 200 μm, preferably larger than 400 μm.

The corrector 5 carries out the inventive deflection 15 of the charged particles in dependence on their energies, whereby corrector 5 is adjusted so that the charged particles with the predetermined energy maintain their direction within a deviation of 3° and preferably within 1°. The particle beam 3, due to its energy distribution, becomes dispersed according to its energy. FIG. 1*a* shows the particle beam 9 with charged particles with the predetermined energy value, a particle beam 9*a* with charged particles with an energy smaller than the predetermined energy, and the particle beam 9*b* with charged particles with an energy larger than the predetermined energy value. Preferably, the corrector 5 does not—or by less than 1%—change the energy of the charged particles of the particle beam 3.

In this embodiment, the energy-depending dispersing of the particle beams 3 is realized by the electric field of an electric multipole, for example an electric dipole, quadrupole or octupole, and by the magnetic field of a magnetic multipole, for example a magnetic dipole, quadrupole or octupole (both not shown in FIG. 1*a*). Both fields are superimposed so that they act, preferably at each point, with the same opposing forces on the charged particles with predetermined energy. The detailed description of the electric and magnetic fields within corrector 5 is given in the description of FIG. 4.

After leaving the corrector 5, the dispersed particle beam 3 enters the objective lens 7. In this embodiment, the objective lens 7 is used to focus the particle beam 3 onto the target surface 22, which, for example, is the surface of a sample to be inspected, structured or tested. The objective lens 7 is generally an electric, a magnetic or an electromagnetic lens, which are known to a person skilled in the art. In a preferred embodiment, the objective lens 7 is positioned by less than 60 cm, in another preferred embodiment by less than 10 mm away from the target surface 22. Preferably, the charged particles pace along the optical axis through the objective lens 7 with a predetermined energy 9. Thereby, the beam of charged particles with predetermined energy 9 is glided through the objective lens 7 without deflection, which is why spherical and chromatic aberrational effects of objective lens 7 do not occur. Only the beams of charged particles with energies deviating from the predetermined energy value, 9*a* and 9*b,* arrive at the objective lens off-axis and are exposed to spherical and chromatic aberrational efforts. If the energy spread of particle beam 3 is sufficiently small, these effects are, however, of minor importance for the resolution of the particle beam on the target surface 22.

After having passed through the objective lens, the particle beam 3 with the beams 9, 9*a* and 9*b* enters deflector 18. Deflector 18 deflects the beam of charged particles with predetermined energy value by the predetermined deflection angle 12. As a result of the energy-depending deflection force, inherent to the deflector 18, the deflector focuses at the same time the beams of charged particles on the target surface 22, whereby the cross-section of the particle beam on the target surface forms the focus area 24. Preferably, the first electric field and the first magnetic field of the corrector is adjusted so that the deflector 18 generates a minimal focus area 24 at a predetermined deflection angle 12. Due to the additional focusing of the objective lens 7, it is possible that the focus area 24 is smaller than the cross-section of the particle beam at the corrector 5, in spite of the deflection. Preferably, objective lens 7 is adjusted to focus the incoming particle beam 3 onto the target surface 22.

In this embodiment, deflector 18 has an electric multipole electrode (not shown in FIGS. 1*a* and 1*b*), which provide a second electric field for deflecting the particle beam 3. The particle beam deflection point 46 is given by the intersection point of the lines given by the incoming charged particles with the predetermined energy value and the charged particles with the predetermined energy leaving deflector 18. Alternatively, the deflection by the deflector 18 can be conducted by the second magnetic field.

In order to focus the particle beam 3 to a minimal focus area 24, it is advantageous to match the energy depending dispersion of the particle beam by the corrector 5 to the predetermined deflection angle 12. Preferably, the present embodiment includes a controller 30 which calculates the electric and magnetic fields of corrector 5 and first deflector 18 required for an optimum focusing based on a predetermined deflection angle 12 inputted via a control input 26, and activates the fields via a driving unit. In particular, controller 30 can calculate the electric and magnetic fields of corrector 5 and the first deflector 18 in such a way that the focus area 24 on the target surface 22 is minimized.

Preferably, controller 30 also controls objective lens 7 so that the objective lens 7 also focuses the particle beams 3 onto the target surface 22. In this case, the focus of objective lens 7, which reduces the spatial expansion of the particle beam, coincides with the focus of deflector 18 which refocuses the energetically dispersed beam of the particle beam 3. In this case, the focus area 24 can be significantly smaller than the cross-section of the particle beam at the corrector, even for large predetermined deflections angles 12. Therefore, the focus area 24, and therefore the spatial resolution of the particle beam apparatus 50 as well, can be significantly smaller compared to state of the art charged particle beam apparatuses with the deflector in front of the objective lens 7.

Figure 1B:
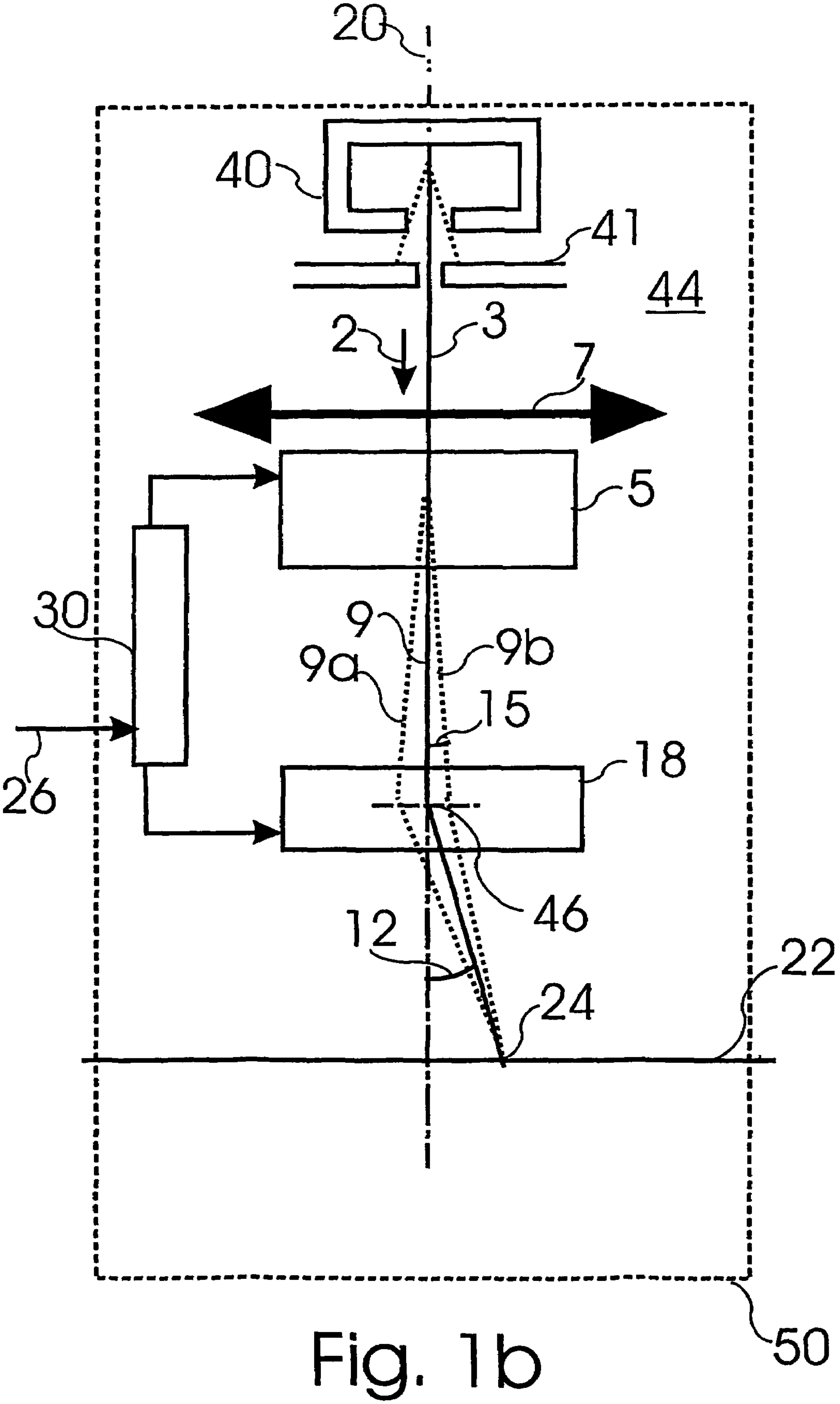
FIG. 1*b* shows a second embodiment according to the invention of a particle beam apparatus with an objective lens in front of the corrector.

FIG. 1*b* shows an inventive embodiment of a particle beam apparatus like in FIG. 1*a,* with the difference that the objective lens 7 is arranged in front of the corrector 5. This embodiment has the advantage that the particle beam 3 passes through the objective lens 7 along the optical axis independent of the energy. This further reduces spherical or chromatic aberrational effects of the objective lens, compared to FIG. 1*a*. However, it is not always possible to position corrector 5 and deflector 18 between the target surface and objective lens 7 for reasons of limited space.

A further advantage of conducting the energy-correcting deflection with an inventive corrector 5 and inventive deflector 18 in FIG. 1*b* in that the strong first electric and first magnetic fields required for an energy-depending correction can be generated in a corrector with a small aperture, since the particle beams 3 are not deflected in corrector 5 but only dispersed. Thereby, the constructional complexity of generating strong electric and magnetic fields with a large aperture is avoided. Only the deflector 18 requires a large aperture; there however only comparably small electric or magnetic fields for the deflection of the particle beam 3 are required.

Figure 2A:
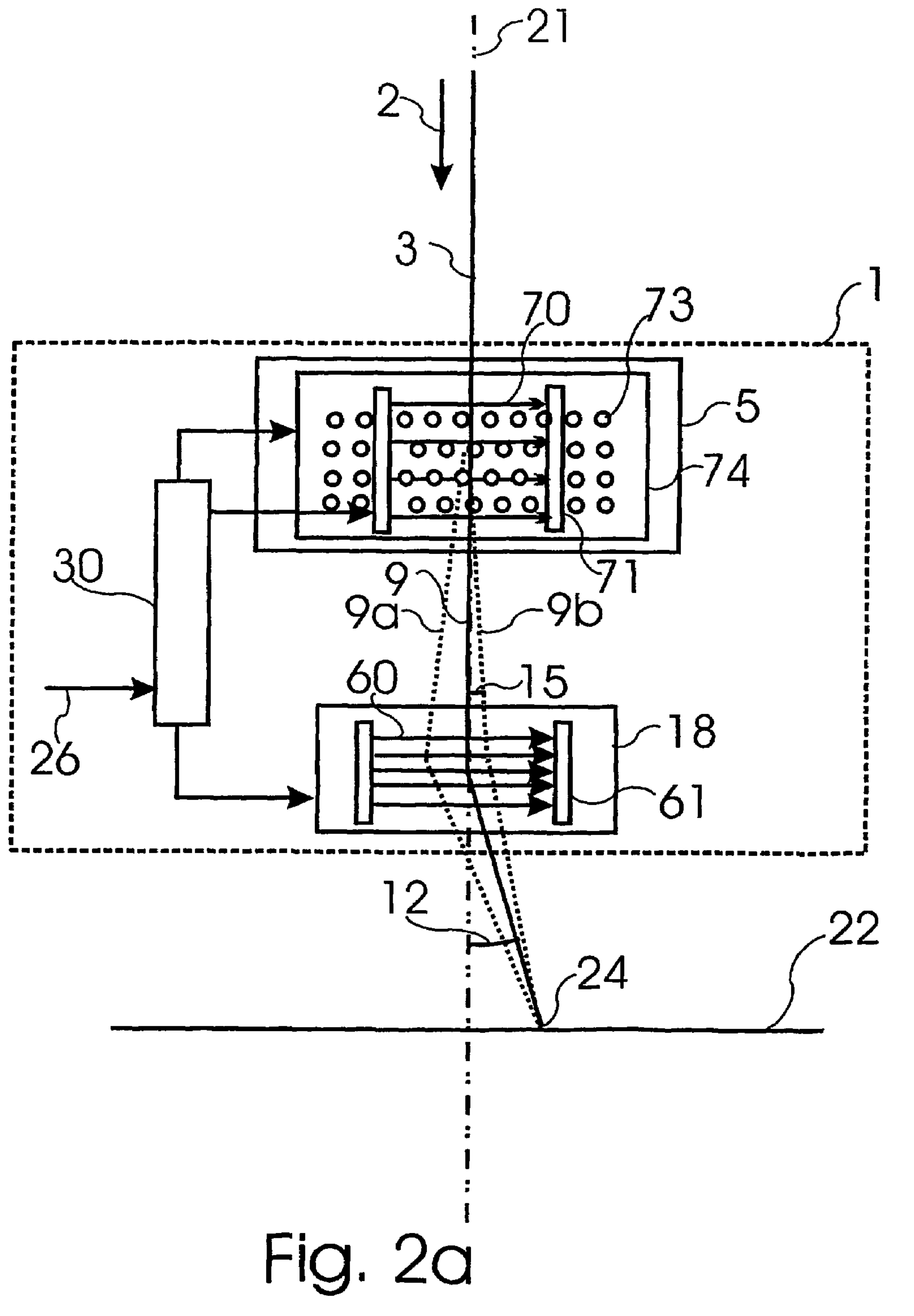
FIGS. 2*a*–*b* show a first embodiment of a device for energy corrected deflection with two direction predetermined deflection angles according to the invention.
Figure 2B:
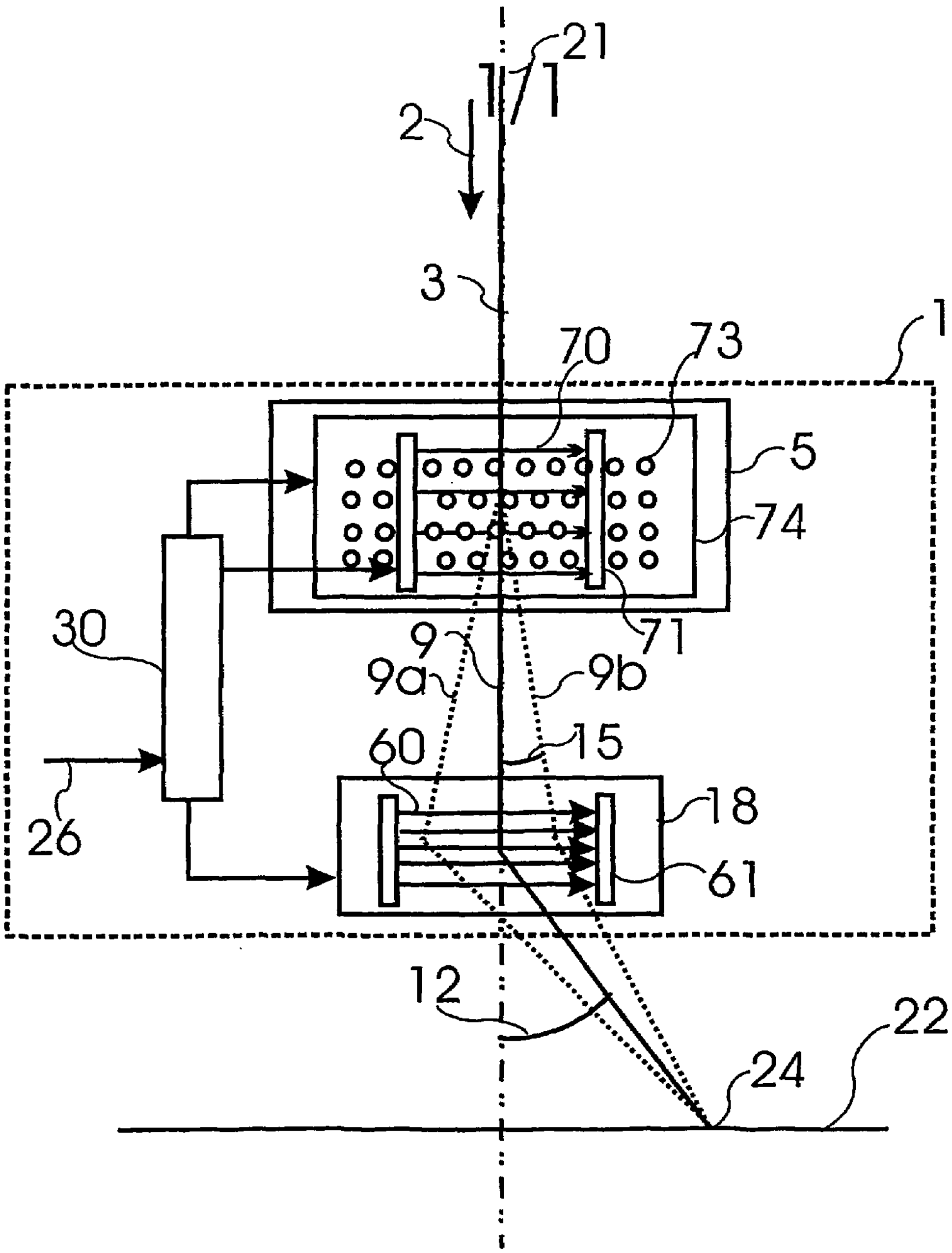

FIGS. 2*a* and 2*b* show an embodiment of the inventive device 1, which can be included, for example, in the particle beam apparatus 50 of FIG. 1*a* or 1*b*. FIGS. 2*a* and 2*b* show the device 1 with a particle beam 3 that comes in along the incoming direction 2 and which is deflected energy dependently by two predetermined deflection angles 12. Particle beam 3 coming in along the incoming direction 2 enters first the corrector 5, which includes a first electric multipole 71 and a first magnetic multipole 74. The first electric multipole 71 generates a first electric field 17 which acts with a lateral force on the incoming particle beam 3. First magnetic multipole 74 generates a first magnetic field 73 which acts with a lateral force on the incoming particle beam 3, thereby opposing the lateral force of the first electric field 17.

The ratio of the two field strengths is adjusted so that the forces acting on the charged particles with a predetermined energy value compensate on average. Therefore, the direction of the incoming charged particles with the predetermined energy value remains unchanged during their passage through corrector 5. Further, the orientation of the first electric field 70 and the first magnetic field 73 is adjusted so that charged particles with an energy smaller than the predetermined energy value are deflected in the direction opposite to the predetermined deflection angle 12. In FIG. 2*a,* the beam of such charged particles is denoted as 9*a*. With the same fields, the beam of charged particles with an energy higher than the predetermined energy value is deflected by a rotational direction that equals the rotational direction representing the predetermined deflection angle 12. In FIG. 2*a,* the beam of such charged particles is denoted as 9*b*.

Preferably, the first electric multipole 71 and the first magnetic multipole 74 are arranged in a way that the first electric field 70 at the particle beam 3 is perpendicular to the particle beam 3, and that the first magnetic field 73 at the particle beam 3 is perpendicular to the particle beam 3 and perpendicular to the first electric field 70. According to a preferred embodiment, the first electric multipole 71 and the first magnetic multipole 74 are dipoles. This is a simple arrangement. However, in this case, the particle beam 3 can only be dispersed within one plane which is given by the orientation of the dipoles.

In a preferred embodiment, the first electric multipole 71 and the first electric multipole 74 are quadrupole or octupoles. In this embodiment, it is possible to freely adjust the plane in which the particle beam 3 is dispersed, by choosing suitable voltages at the electrodes of the electric multipole 71 and suitable currents in the coils of the magnetic multipole 74. This way, the energy corrected deflection can be carried out in any desired plane along the beam axis 20 through a suitable control of the field strengths.

The particle beam 3, dispersed by the corrector 5, enters the deflector 18 afterwards. In this preferred embodiment, the deflector 18 includes a second electric multipole 61, which generates a second electric field 60. Analogously to corrector 5, the second electric multipole 61 is preferably a dipole, quadrupole or octupole, depending on whether the first electric multipole 71 is a dipole, quadrupole or octupole. Preferably, the second electric multipole 61 is arranged symmetrically to the beam axis 20. This way, it can be made sure that the second electric field 16 of the deflector is parallel or antiparallel to the first electric field 70 of the corrector 50. This ensures that the deflection by the predetermined deflection angle 12 in conducted within the same plane as the deflection 15 of the particle beam 3 by the corrector 5, which is a prerequisite for an efficient energy correction for a predetermined deflection.

Since an electric field effects a larger direction change on charged particles with a small energy compared to charged particles with a large energy, the beam of charged particles with an energy smaller than the predetermined energy 9*a* is deflected by more than the beam of charged particles with an energy larger than the predetermined energy 9*b*. This is why the charged particles become focused to form a focus area 24 on the target plane.

Further, FIG. 2*a* shows the controller 30 which tunes the field strengths of the electric and magnetic fields of the corrector 5 and the deflector 18 to each other. This is required in particular if the predetermined deflection angle 12 is varied continuously, since for each predetermined deflection angle 12, different electric and magnetic fields have to be applied to corrector 5 and first deflector 18. Particularly, if the focus area 24 on the target surface 22 has to be made small or even minimized, the field strengths of corrector 5 and the first deflector 18 have to be exactly tuned with respect to each other. The tuning is preferably based on calculations carried out in controller 30 using a predetermined algorithm.

FIG. 2*b* shows the device 1 differing from FIG. 2*a* in that the predetermined deflection angle 12 is enlarged. The larger variation of the deflection angle 12 requires a stronger second electric field 60 for deflection and, at the same time, a larger dispersing of the particle beam 3 in corrector 5 to minimize the focus area 24 of the particle beam on the target plane. The larger dispersing of the particle beam 3 in corrector 5 is realized by an increase of the field strengths of the first electric field 70 and the first magnetic field 73 whereby, at the same time, the ratio of the two field strengths is kept constant.

Figure 3A:
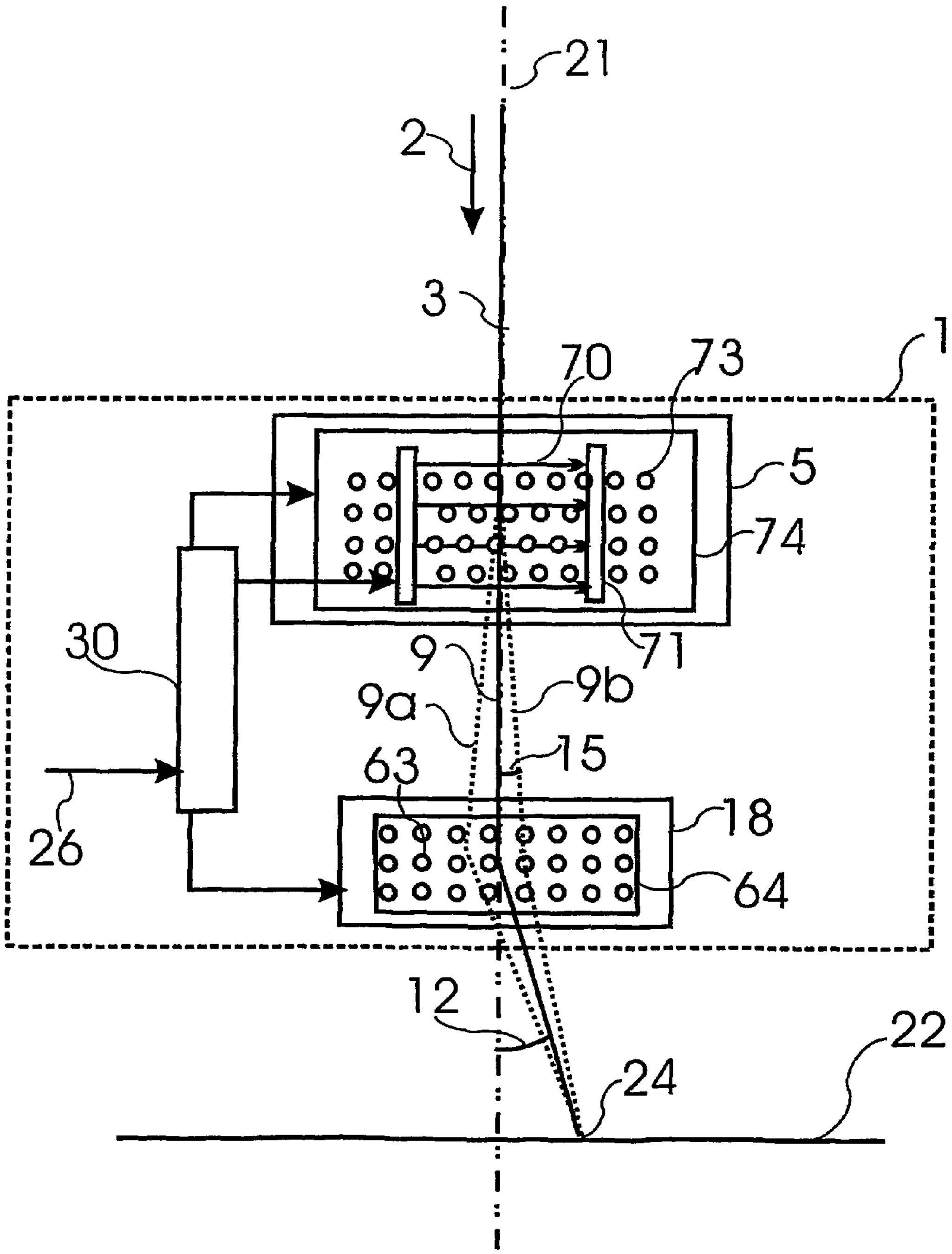
FIGS. 3*a*–*b* show a second embodiment of a device for energy corrected deflection with two different predetermined deflection angles according to the invention.
Figure 3B:
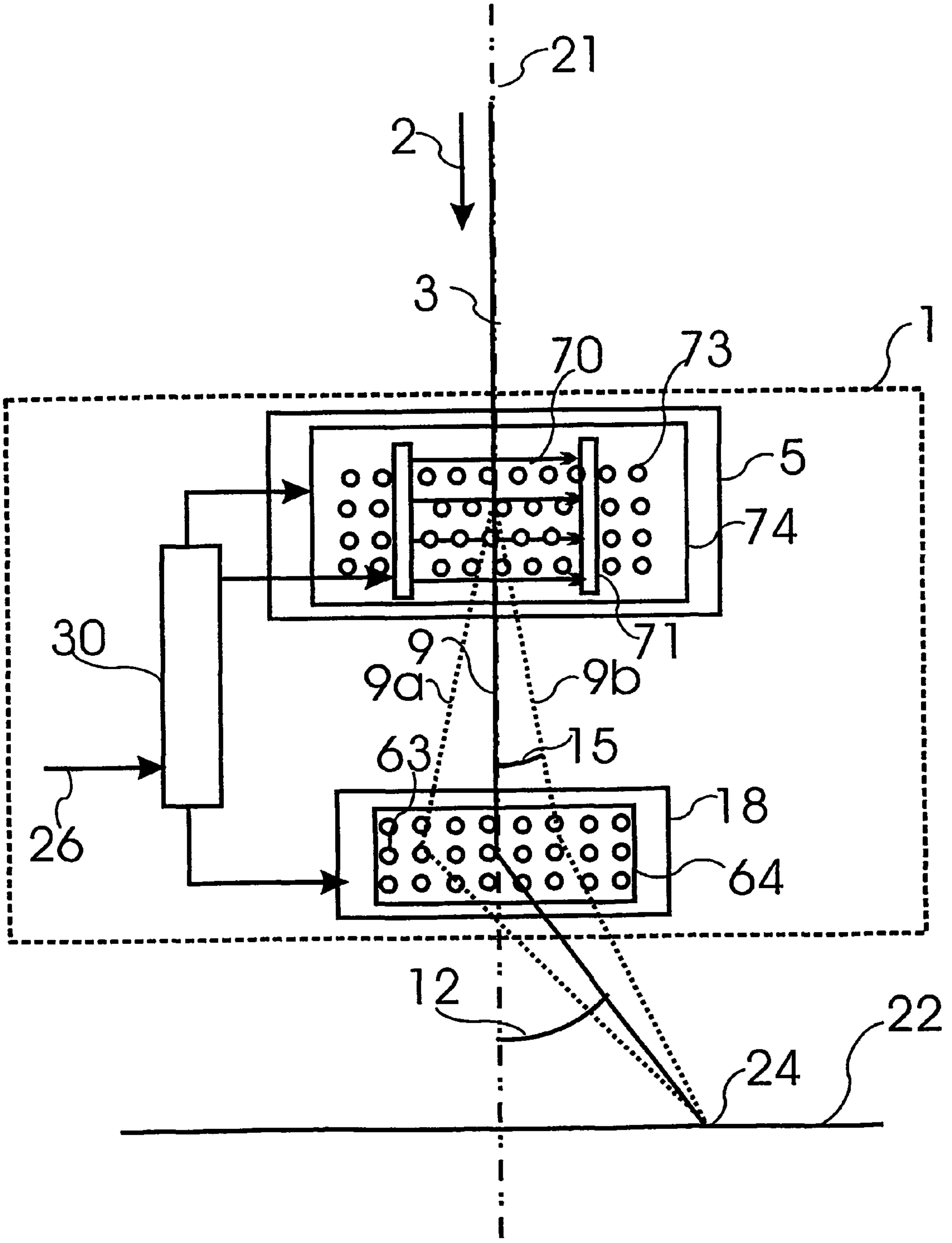

FIGS. 3*a* and 3*b* show the same device 1 as FIGS. 2*a* and 2*b*, with the difference that the deflector 18 includes a second magnetic multipole 64 for generation of the second magnetic field 63. In this embodiment, the particle beam is not deflected by an electric field, but by the second magnetic field 63 generated by the second magnetic multipole 64. Preferably, the direction of the second magnetic field 63 is similar to the direction of the first magnetic field 73, in order to realize an optimal energy correction upon deflection. Preferably, the second magnetic multipole 64 is preferably a dipole, quadrupole or octupole, depending on whether the first magnetic multipole 74 is a dipole, quadrupole or octupole.

Figure 4A:
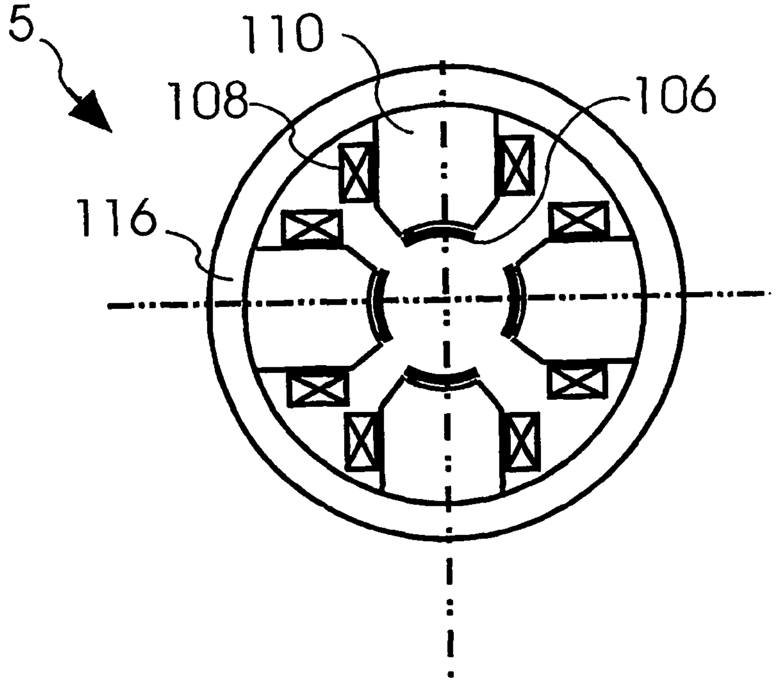
FIGS. 4*a*–*b* show an embodiment of a corrector according to the invention.
Figure 4B:
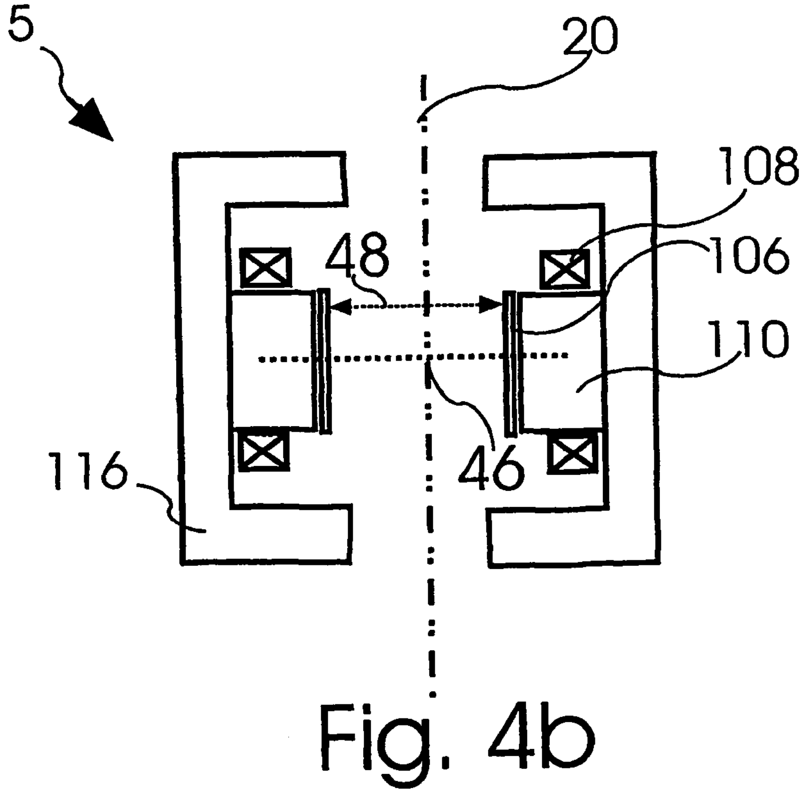

It is also necessary for the device 1 in FIGS. 3*a* and 3*b* that for each predetermined deflection angle 12, the fields of the corrector 5 are adjusted anew to minimize the focus area 24 on a predetermined target surface 22. Thus, the dispersing of the particle beam 3 by corrector 5 is significantly larger in FIG. 3*b* in order to deflect the particle beam by the significantly larger deflection angle 12 and in order to be able to focus the particle beam 3 on a comparably large focus area 24. FIG. 4*a* and 4*b* show the schematic embodiment of the corrector 5 with a magnetic quadrupole and an electric quadrupole. FIG. 4*a* shows the cross-section along the corrector 5 in the plane perpendicular to the beam axis 20. FIG. 4*b* shows the same corrector 5 as a side view along the beam axis 20.

In a housing 116, four coils 108 with the four pole pieces 110 are attached, which each are rotated with respect to each other by 90° and which together form the magnetic quadrupole. The four coils 108 and the four pole pieces 110 are preferably arranged symmetrically to the beam axis 20. By applying suitable currents at the four coils 108, a first magnetic field perpendicular to the beam axis 20 with an arbitrary rotational direction around the beam axis 20 can be generated.

Symmetrically to the four pole pieces 110, there are further attached four deflection plates 106 which together form the electric quadrupole. By applying suitable voltages at the four deflection plates 106, the first electric field perpendicular to the beam axis 20 with an arbitrary rotational direction around the beam axis 20 can be generated. Further, it is possible, by applying suitable voltages at the deflection plates 106, that the first electric field is aligned perpendicular to the beam axis 20 and perpendicular to the direction of the first magnetic field. Thereby, the corrector 5 is able to disperse the particle beam within any plane along the beam direction to deflect the particle beam 3 energy-correctedly into any direction by means of the deflector 18.

Due to the high geometric symmetry between the four magnetic pole pieces 110 and the four deflection plates 106 with respect to the beam axis 20, the first magnetic field and the second electric field can be orientated perpendicular with respect to each other at the beam axis 20 with high precision; further, due to the similar positioning of the electric deflection plates 106 with respect to the magnetic pole pieces 110 with respect to the position of the particle beam path, the particle beam deflection point of the electric quadrupole can be made to deviate from the particle beam deflection point of the magnetic quadrupole by less than 10 mm, and preferably by less than 5 mm. Thc smaller this distance, the smaller is the parallel shift between the particle beam arriving at corrector 5 and the particle beam leaving the corrector 5. In FIG. 4*b*, a particle beam deflection point 46, common to the second electric and the second magnetic field, is shown, whereby the distance between the two particle beam deflection points in smaller than 10 mm.

The diameter of aperture 114 in this embodiment is given by the distance between the opposing deflection plates 106. Since corrector 5 does not deflect the particle beam, but only disperses the particle beam, the diameter of aperture 114 can be kept small, which reduces the complexity for the generation of the required first electric and the first magnetic field significantly.

Corrector 5 with the electric or magnetic quadrupole is only one example illustrating how the corrector can be constructed. For many applications, instead of using quadrupoles, electric and magnetic dipoles are sufficient. Those dipoles can be designed in a similar way as shown in FIG. 4*a* and FIG. 4*b* with the preferred difference that, instead of the four pole pieces, coils and deflection plates rotated with respect to each other by 90°, only two are arranged with the respective two pole pieces, coils and deflection plates rotated with respect to each other by 180°.

In a similar manner, the corrector can include electric and magnetic octupoles, instead of dipoles or quadrupoles. The electric and magnetic octupoles include, instead of the four pole pieces, coils and deflection plates rotated with respect to each other by 90°, eight pole pieces, coils and deflection plates rotated with respect to each other by 45°. With octupoles, it is possible to provide an even higher homogeneity of the first electric and a first magnetic field at the beam axis 20 upon a rotation of the electric and magnetic dipole fields around the beam axis 20.

The invention claimed is:

1. A particle beam apparatus having:

a particle beam source for generating a particle beam of charged particles with energy values distributed around a predetermined energy value;

an objective lens having an optical axis, whereby the charged particles with the predetermined energy value pass through the objective lens along the optical axis;

a corrector which, by means of a first electric field and a superimposed first magnetic field, deflects the charged particles depending on their energies, whereby the charged particles with the predetermined energy value maintain their direction during their passage through the corrector; and a deflector which is applied after the corrector and the objective lens and which, by means of a second electric field or by means of a second magnetic field, deflects the charged particles with the predetermined energy value by a predetermined deflection angle away from the optical axis, whereby the charged particles become focused.

2. The particle beam apparatus according to claim 1, wherein the objective lens is applied after the corrector.

3. The particle beam apparatus according to claim 1, wherein the corrector is applied after the objective lens.

4. The particle beam apparatus according to claim 1, wherein a controller controls the corrector and the deflector so that the charged particles with the predetermined energy value, during the passage through the corrector, maintain their direction independently of the predetermined deflection angle and the deflector focuses the charged particles onto a target surface independently of the predetermined deflection angle.

5. A device for an energy-corrected deflection by a predetermined deflection angle of a particle beam coming in along a beam axis, whereby the particle beam consists of charged particles with energy values distributed around a predetermined energy value, having:

a corrector which, by means of a first electric field and a superimposed first magnetic field deflects the charged particles depending on their energies, whereby the charged particles with the predetermined energy value maintain their direction during their passage through the corrector;

a deflector which is applied after the corrector and which, by means of a second electric field or by means of a second magnetic field deflects the charged particles with the predetermined energy value by a predetermined deflection angle away from the beam axis; and a controller controlling the corrector and the deflector so that the charged particles with the predetermined energy value maintain their direction during the passage through the corrector independent of the predetermined deflection angle, and the deflector focuses the charged particles onto a target surface independently of the predetermined deflection angle.

6. The device according to claim 5, wherein the corrector comprises a first electric multipole for generating the first electric field and a first magnetic multipole for generating the first magnetic field.

7. The device according to claim 6, wherein the deflector comprises a second electric multipole for generating the second electric field or a second magnetic multipole for generating the second magnetic field.

8. The device according to claim 7, wherein the second electric multipole and/or the first electric multipole are electric dipoles, and/or the second magnetic multipole and/or the first magnetic multipole are magnetic dipoles.

9. The device according to claim 7, wherein the second electric multipole, the first electric multipole, the second magnetic multipole and/or the first magnetic multipole are magnetic or electric octupoles.

10. The device according to claim 7, wherein the first magnetic multipole and/or the second magnetic multipole comprises saddle coils or toroid coils.

11. The device according to claim 7, wherein the second electric multipole is an electric dipole and/or the second magnetic multipole is a magnetic dipole.

12. The device according to claim 7, wherein the second electric multipole and/or the second magnetic multipole are magnetic or electric octupoles.

13. The device according to claim 6, wherein the first electric multipole is an electric dipole and/or the first magnetic multipole is a magnetic dipole.

14. The device according to claim 6, wherein the first electric multipole and/or the first magnetic multipole are magnetic or electric octupoles.

15. The device according to claim 6, wherein the first magnetic multipole comprises saddle coils or toroid coils.

16. The device according to claim 5, wherein the first magnetic field and/or the second magnetic field are concentrated by magnetic poles pieces.

17. The device according to claim 5, wherein the controller controls a first electric multipole, a first magnetic multipole, and the deflector synchronously.

18. The device according to claim 5, wherein the charged particles are electrons, which are generated by a thermionic electron beam source.

19. A method for an energy-corrected deflection by a predetermined deflection angle of a particle beam coming in along a beam axis, whereby the particle beam consists of charged particles with energy values distributed around a predetermined energy value, comprising:

applying deflections to the charged particles of the incoming particle beam depending on their energies, whereby the charged particles with the predetermined energy value maintain their direction;

thereafter, deflecting the charged particles with the predetermined energy value by the predetermined deflection angle away from the beam axis, whereby the charged particles become focused; and controlling the deflections so that the charged particles are focused independently of the deflection angle.

20. The method according to claim 19, wherein the particle beam becomes focused, whereby the focus area, independent of the predetermined deflection angle, is smaller than one time the cross-section of the particle beam at the position of the deflection.

* * * * *

UNITED STATES PATENT AND TRADEMARK OFFICE

CERTIFICATE OF CORRECTION

PATENT NO. : 7,105,833 B2
APPLICATION NO. : 10/477664
DATED : September 12, 2006
INVENTOR(S) : Brunner et al.

It is certified that error appears in the above-identified patent and that said Letters Patent is hereby corrected as shown below:

Column 3, Line 45: Change “smallby” to --small by--

Column 4, Line 11: Change “Surfaces” to --surfaces--

Column 4, line 19: Change “tree” to --free--

Column 4, Line 49: Change “or” to --of--

Column 6, Line 36: Change “it” to --if--

Column 6, Line 36: Change “strength” to --strengths--

Column 7, Line 26: Change “or” to --of--

Column 8, Line 30: Before “advantageous”, insert --an--

Column 8, Line 34: Change “ouch” to --such--

Column 9, Line 47: Change “13” to --18--

Column 10, Line 67: Change “pace” to --pass--

Column 11, Line 3: Change “glided” to --guided--

Column 11, Line 8: Change “efforts” to --effects--

UNITED STATES PATENT AND TRADEMARK OFFICE

CERTIFICATE OF CORRECTION

PATENT NO. : 7,105,833 B2
APPLICATION NO. : 10/477664
DATED : September 12, 2006
INVENTOR(S) : Brunner et al.

It is certified that error appears in the above-identified patent and that said Letters Patent is hereby corrected as shown below:

Column 12, Line 9: Change “in” to --is--

Signed and Sealed this

Third Day of April, 2007

JON W. DUDAS

*Director of the United States Patent and Trademark Office*